United States Patent
Guo et al.

(10) Patent No.: US 10,545,402 B2
(45) Date of Patent: Jan. 28, 2020

(54) OVERLAY COMPENSATION METHOD AND SYSTEM THEREOF

(71) Applicants: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

(72) Inventors: Lingyi Guo, Shanghai (CN); Yi Shih Lin, Shanghai (CN)

(73) Assignees: SEMICONDUCTOR MANUFACTURING INTERNATIONAL (SHANGHAI) CORPORATION (CN); SEMICONDUCTOR MANUFACTURING INTERNATIONAL (BEIJING) CORPORATION (CN)

( * ) Notice: Subject to any disclaimer, the term of this patent is extended or adjusted under 35 U.S.C. 154(b) by 0 days.

(21) Appl. No.: 16/121,354

(22) Filed: Sep. 4, 2018

(65) Prior Publication Data
US 2019/0072848 A1 Mar. 7, 2019

(30) Foreign Application Priority Data
Sep. 4, 2017 (CN) .......................... 2017 1 0783414

(51) Int. Cl.
*G06F 17/50* (2006.01)
*G03F 1/36* (2012.01)
*G03F 1/42* (2012.01)

(52) U.S. Cl.
CPC . *G03F 1/36* (2013.01); *G03F 1/42* (2013.01)

(58) Field of Classification Search
CPC .......... G03F 1/36; G03F 1/42; G06F 17/5068; G06F 17/5072
(Continued)

(56) References Cited

U.S. PATENT DOCUMENTS

| 2005/0154484 A1* | 7/2005 | Lee .......................... G03F 7/705 700/121 |
| 2005/0157296 A1* | 7/2005 | Hayano ............... G03F 7/70633 356/401 |

(Continued)

*Primary Examiner* — Suchin Parihar
(74) *Attorney, Agent, or Firm* — Innovation Counsel LLP

(57) ABSTRACT

An overlay compensation method and a related system are presented. The method includes: acquiring a first offset vector reflecting the relative position between overlay marks of a middle and a bottom target layers; acquiring a second offset vector reflecting the relative position between the overlay marks of a top and the middle target layers; decomposing the first offset vector into a first compensable component and a first uncompensable component; decomposing the second offset vector into a second compensable component and a second uncompensable component; computing minimum values of the first uncompensable component and the second uncompensable component; computing optimized values for the first compensable component and the second compensable component; and computing a third compensable component of a third offset vector reflecting the relative position between the overlay marks of the top and the bottom target layers.

15 Claims, 5 Drawing Sheets

(58) Field of Classification Search
USPC .......................................................... 716/53
See application file for complete search history.

(56) References Cited

U.S. PATENT DOCUMENTS

2011/0115463 A1* 5/2011 Acar .................. G03F 7/70633
　　　　　　　　　　　　　　　　　　　　　324/71.1
2019/0094721 A1* 3/2019 Tinnemans ........... G03F 9/7046

* cited by examiner

OVERLAY COMPENSATION METHOD AND SYSTEM THEREOF

CROSS-REFERENCE TO RELATED APPLICATION

This application claims priority to and benefit of Chinese Patent Application No. 201710783414.X filed on Sep. 4, 2017, which is incorporated herein by reference in its entirety.

BACKGROUND

(a) Field of the Invention

This inventive concept relates to semiconductor technology and, more specifically to an overlay compensation method and a system thereof.

(b) Description of the Related Art

With the development in semiconductor manufacturing techniques, a groove-followed-by-through-hole technique has been developed in many manufacturing processes. In a Back-End-Of-Line (BEOL) process, a lithography process is typically adjusted by overlay compensation to a key layer, this adjustment, however, does not provide a good control over the lithography process.

FIG. 1 shows a cross-sectional view illustrating a semiconductor structure formed in a conventional manufacturing process. In FIG. 1, the semiconductor structure may comprise a bottom metal layer 11, a through-hole layer 12, and a top metal layer 13. The bottom metal layer 11 and the top metal layer 13 may work as a wire layer for semiconductor structures on the bottom and on the top, respectively. For example, grooves may be formed in the semiconductor structures on the bottom and on the top by a lithography process, and wire layers may be formed in these grooves. The through-hole layer 12 may comprise a metal contact hole 121 comprising a through-hole connecting the bottom metal layer 11 and the top metal layer 13, and a metal contact component filling the through-hole. In a manufacturing process, the through-hole need to be precisely aligned with the grooves in the semiconductor structures on the bottom and on the top, so that the metal contact hole 121 can be properly connected to the bottom metal layer 11 and the top metal layer 13.

Conventionally, a manufacturing process may be conducted in one of the following two variations. In the first variation, a bottom metal layer may first be formed, followed by a middle through-hole layer and a top metal layer to form the structure shown in FIG. 1. In the second variation, a bottom metal layer may first be formed, followed by a middle metal layer and a top through-hole layer to form a semiconductor structure where the through-hole layer is on the top. In the second variation, when forming the bottom metal layer, the grooves in the bottom metal layer may be filled with Cu, and Chemical Mechanical Processing (CMP) may be applied on the bottom metal layer before forming the middle metal layer. Lithography process and etching process may be conducted when forming the middle metal layer, and the etching process will stop upon reaching a hard mask layer. When forming the top through-hole layer, a regular exposure process may be used, and an etching process that etches through the middle metal layer may be conducted to form a through-hole connecting the bottom metal layer to the top through-hole layer.

In either of these two variations, the overlay shift between the middle and the top layers and the overlay shift between the bottom and the top layers need to be minimized to achieve good alignments. Doing so, however, may result in a large overlay shift between the middle and the bottom layers. That is, in conventionally manufacturing processes, good alignment between the middle and the top layers and that between the bottom and the top layers are achieved at the expense of large overlay shift between the middle and the bottom layers.

Large overlay shift between the middle and the bottom layers may lead to alignment issues between these two layers, which in turn leads to higher defect rate and more rework in the manufacturing processes. All of these issues result in increased manufacturing cost and lowered production yield, thus an overlay compensation method that can remedy at least some of these issues are desirable.

SUMMARY

Based on the investigations on the limitations of conventional manufacturing methods, this inventive concept presents an overlay compensation method and a related system that remedy at least some limitations in the conventional manufacturing methods.

This inventive concept first presents an overlay compensation method, comprising:

acquiring a first offset vector reflecting the relative position between an overlay mark of a middle target layer and an overlay mark of a bottom target layer;

acquiring a second offset vector reflecting the relative position between an overlay mark of a top target layer and the overlay mark of the middle target layer;

decomposing the first offset vector into a first compensable component and a first uncompensable component;

decomposing the second offset vector into a second compensable component and a second uncompensable component;

conducting a minimization process on the first uncompensable component and the second uncompensable component to compute minimum values of the first uncompensable component and the second uncompensable component;

computing an optimized first compensable component based on the first offset vector and the minimum value of the first uncompensable component;

computing an optimized second compensable component based on the second offset vector and the minimum value of the second uncompensable component; and computing a third compensable component of a third offset vector reflecting the relative position between the overlay marks of the top target layer and the bottom target layer based on optimized first compensable component and optimized second compensable component.

Additionally, the aforementioned method may further comprise:

computing overlay compensation parameters based on the third compensable component; and conducting a compensation process on the overlay mark of the bottom target layer and the overlay mark of the top target layer based on the overlay compensation parameters.

Additionally, in the aforementioned method, conducting a minimization process on the first uncompensable component and the second uncompensable component may comprise:

computing the first compensable component and the second compensable component based on nth-order linear regression equations and center coordinates of the overlay marks of the corresponding target layers, wherein the first compensable component and the second compensable component are each represented by an nth-order linear function, with n being a positive integer;

computing the first uncompensable component based on the first offset vector and the first compensable component, wherein the first uncompensable component equals to the first offset vector minus the first compensable component, and wherein the first uncompensable component is an nth-order function of the center coordinates of the overlay marks of the middle and the bottom target layers;

computing the second uncompensable component based on the second offset vector and the second compensable component, wherein the second uncompensable component equals to the second offset vector minus the second compensable component, and wherein the second uncompensable component is an nth-order function of the center coordinates of the overlay marks of the top and the middle target layers; and computing minimum values of the first and the second uncompensable components.

Additionally, in the aforementioned method, the first compensable component and the second compensable component may be computed based on the nth-order linear regression equations and the center coordinates of the overlay marks of the corresponding target layers under the least square constraint.

Additionally, in the aforementioned method, the overlay compensation parameters may comprise:

Translation X, Translation Y, Wafer Rotation (including rotation angle and rotation direction), Wafer Non-Orthogonality, Wafer Expansion X, Wafer Expansion Y, Shot Rotation, Shot Magnification, Shot Asymmetric Rotation, and Shot Asymmetric Magnification.

This inventive concept further presents an overlay compensation system, comprising:

an offset vector acquisition unit that acquires a first offset vector and a second offset vector, wherein the first offset vector reflects the relative position between an overlay mark of a middle target layer and an overlay mark of a bottom target layer, and the second offset vector reflects the relative position between an overlay mark of a top target layer and the overlay mark of the middle target layer a vector decomposition unit that decomposes the first offset vector into a first compensable component and a first uncompensable component, and decomposes the second offset vector into a second compensable component and a second uncompensable component;

a minimization processing unit that conducts a minimization process on the first uncompensable component and the second uncompensable components to compute minimum values of the first uncompensable component and the second uncompensable component;

an optimization unit that computes an optimized first compensable component based on the first offset vector and the minimum value of the first uncompensable component, and computes an optimized second compensable component based on the second offset vector and the minimum value of the second uncompensable component; and a compensable component acquisition unit that, based on optimized first compensable component and optimized second compensable component, computes a third compensable component of a third offset vector that reflects the relative position between the overlay mark of the top target layer and the overlay mark the bottom target layer.

Additionally, the aforementioned system may further comprise:

an overlay parameter computation unit that computes overlay compensation parameters based on the third compensable component; and a compensation process unit that conducts a compensation process on the overlay marks of the bottom and the top target layers based on the overlay compensation parameters.

Additionally, in the aforementioned system, the minimization process component may comprise:

a linear regression computation module that computes the first compensable component and the second compensable component based on nth-order linear regression equations and center coordinates of the overlay marks of the corresponding target layers, wherein the first compensable component and the second compensable component are each represented by an nth-order linear function, with n being a positive integer;

an uncompensable component computation module that computes the first uncompensable component and the second uncompensable component, wherein the first uncompensable component is computed based on the first offset vector and the first compensable component, and equals to the first offset vector minus the first compensable component, and the second uncompensable component is computed based on the second offset vector and the second compensable component, and equals to the second offset vector minus the second compensable component, and wherein the first uncompensable component is an nth-order function of the center coordinates of the overlay marks of the middle and the bottom target layers, and the second uncompensable component is an nth-order function of the center coordinates of the overlay marks of the top and the middle target layers; and a minimization computation module that computes minimum values of the first uncompensable component and the second uncompensable component.

Additionally, in the aforementioned system, the linear regression computation module may compute the first compensable component and the second compensable component based on the nth-order linear regression equations and the center coordinates of the overlay marks of the corresponding target layers under the least square constraint.

Additionally, in the aforementioned system, the overlay compensation parameters may comprise:

Translation X, Translation Y, Wafer Rotation (including rotation angle and rotation direction), Wafer Non-Orthogonality, Wafer Expansion X, Wafer Expansion Y, Shot Rotation, Shot Magnification, Shot Asymmetric Rotation, and Shot Asymmetric Magnification.

This inventive concept further presents a machine readable storage medium with computer instructions stored in it. When the computer instructions are executed, one of the aforementioned overlay compensation methods is conducted.

BRIEF DESCRIPTION OF THE DRAWINGS

The accompanying drawings, which are incorporated herein and constitute a part of the specification, illustrate different embodiments of the inventive concept and, together with the detailed description, serve to describe more clearly the inventive concept.

DETAILED DESCRIPTION OF THE EMBODIMENTS

Figure 1:
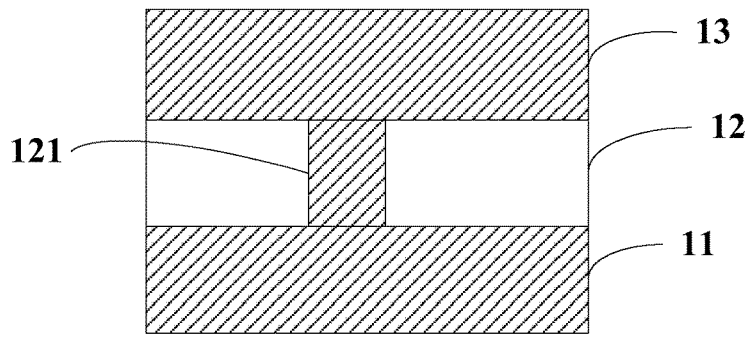
FIG. 1 shows a cross-sectional view illustrating a semiconductor structure formed by a conventional manufacturing process.

Example embodiments of the inventive concept are described with reference to the accompanying drawings. As those skilled in the art would realize, the described embodiments may be modified in various ways without departing from the spirit or scope of the inventive concept. Embodiments may be practiced without some or all of these specified details. Well known process steps and/or structures may not be described in detail, in the interest of clarity.

The drawings and descriptions are illustrative and not restrictive. Like reference numerals may designate like (e.g., analogous or identical) elements in the specification. To the extent possible, any repetitive description will be minimized.

Relative sizes and thicknesses of elements shown in the drawings are chosen to facilitate description and understanding, without limiting the inventive concept. In the drawings, the thicknesses of some layers, films, panels, regions, etc., may be exaggerated for clarity.

Embodiments in the figures may represent idealized illustrations. Variations from the shapes illustrated may be possible, for example due to manufacturing techniques and/or tolerances. Thus, the example embodiments shall not be construed as limited to the shapes or regions illustrated herein but are to include deviations in the shapes. For example, an etched region illustrated as a rectangle may have rounded or curved features. The shapes and regions illustrated in the figures are illustrative and shall not limit the scope of the embodiments.

Although the terms "first," "second," etc. may be used herein to describe various elements, these elements shall not be limited by these terms. These terms may be used to distinguish one element from another element. Thus, a first element discussed below may be termed a second element without departing from the teachings of the present inventive concept. The description of an element as a "first" element may not require or imply the presence of a second element or other elements. The terms "first," "second," etc. may also be used herein to differentiate different categories or sets of elements. For conciseness, the terms "first," "second," etc. may represent "first-category (or first-set)," "second-category (or second-set)," etc., respectively.

If a first element (such as a layer, film, region, or substrate) is referred to as being "on," "neighboring," "connected to," or "coupled with" a second element, then the first element can be directly on, directly neighboring, directly connected to or directly coupled with the second element, or an intervening element may also be present between the first element and the second element. If a first element is referred to as being "directly on," "directly neighboring," "directly connected to," or "directly coupled with" a second element, then no intended intervening element (except environmental elements such as air) may also be present between the first element and the second element.

Spatially relative terms, such as "beneath," "below," "lower," "above," "upper," and the like, may be used herein for ease of description to describe one element or feature's spatial relationship to another element(s) or feature(s) as illustrated in the figures. It will be understood that the spatially relative terms may encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientation), and the spatially relative descriptors used herein shall be interpreted accordingly.

The terminology used herein is for the purpose of describing particular embodiments and is not intended to limit the inventive concept. As used herein, singular forms, "a," "an," and "the" may indicate plural forms as well, unless the context clearly indicates otherwise. The terms "includes" and/or "including," when used in this specification, may specify the presence of stated features, integers, steps, operations, elements, and/or components, but may not preclude the presence or addition of one or more other features, integers, steps, operations, elements, components, and/or groups.

Unless otherwise defined, terms (including technical and scientific terms) used herein have the same meanings as what is commonly understood by one of ordinary skill in the art related to this field. Terms, such as those defined in commonly used dictionaries, shall be interpreted as having meanings that are consistent with their meanings in the context of the relevant art and shall not be interpreted in an idealized or overly formal sense unless expressly so defined herein.

The term "connect" may mean "electrically connect." The term "insulate" may mean "electrically insulate."

Unless explicitly described to the contrary, the word "comprise" and variations such as "comprises," "comprising," "include," or "including" may imply the inclusion of stated elements but not the exclusion of other elements.

Various embodiments, including methods and techniques, are described in this disclosure. Embodiments of the inventive concept may also cover an article of manufacture that includes a non-transitory computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the inventive concept may also cover apparatuses for practicing embodiments of the inventive concept. Such apparatus may include circuits, dedicated and/or programmable, to carry out operations pertaining to embodiments of the inventive concept. Examples of such apparatus include a general purpose computer and/or a dedicated computing device when appropriately programmed and may include a combination of a computer/computing device and dedicated/programmable hardware circuits (such as electrical, mechanical, and/or optical circuits) adapted for the various operations pertaining to embodiments of the inventive concept.

Figure 2:
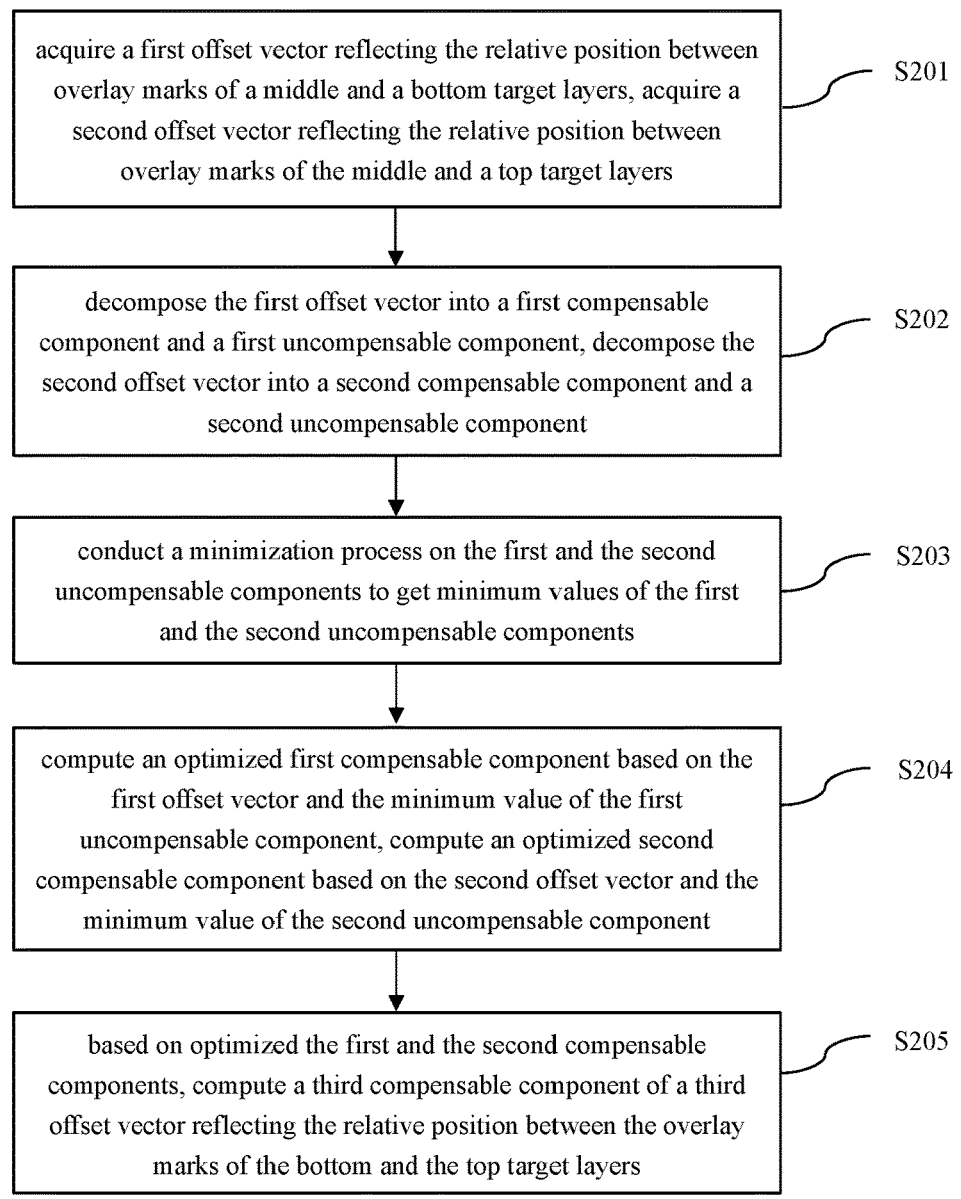
FIG. 2 shows a flowchart illustrating an overlay compensation method in accordance with one embodiment of this inventive concept.
Figure 3:
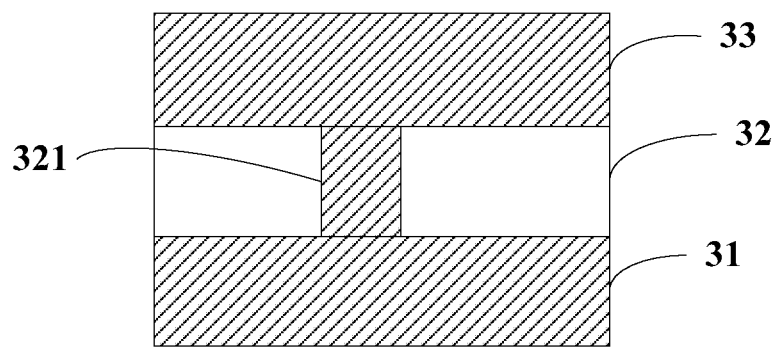
FIG. 3 shows a cross-sectional view illustrating a semiconductor structure formed by a manufacturing process in accordance with one embodiment of this inventive concept.

FIG. 2 shows a flowchart illustrating an overlay compensation method in accordance with one embodiment of this inventive concept. FIG. 3 shows a cross-sectional view illustrating a semiconductor structure formed by a manufacturing process in accordance with one embodiment of this inventive concept. This overlay compensation method is described below with reference to these drawings.

Referring to FIG. 2, in step S201, a first offset vector reflecting the relative position between an overlay mark of a middle target layer and an overlap mark of a bottom target layer is acquired, a second offset vector reflecting the relative position between an overlay mark of a top target layer and the overlay mark of the middle target layer is acquired.

When manufacturing a semiconductor structure shown in FIG. 3, a first offset vector reflecting the relative position between an overlay mark of the middle target layer 32 and an overlay mark of the bottom target layer 31 may be acquired, and a second offset vector reflecting the relative position between the overlay mark of the middle target layer 32 and an overlay mark of the top target layer 33 may be acquired.

Referring to FIG. 3, in one embodiment, the bottom target layer 31 may be a bottom metal layer, the middle target layer 32 may be a middle through-hole layer, and the top target layer 33 may be a top metal layer. The middle target layer 32 may comprise a metal contact hole 321. The bottom target layer 31, the middle target layer 32 and the top target layer 33 may be other types of layers, and this inventive concept is not limited herein. For example, the bottom target layer may be a bottom metal layer, the middle target layer may be a middle metal layer, and the top target layer may be a top through-hole layer.

When manufacturing these layers, grooves may be formed in the semiconductor structures on the bottom and on the top by a lithography process, and these grooves may be filled with metal to form the bottom target layer and the top target layer. A through-hole may be formed in the middle target layer by a lithography process, this through-hole may be filled with a metallic material to form a metal contact hole. The lithography process used in these steps may involve overlay techniques, and overlay marks corresponding to each of the bottom target layer, the middle target layer and the top target layer may be formed. Due to manufacturing variations, these overlay marks may not be precisely aligned with each other.

In one embodiment of this inventive concept, the positions of the overlay marks of the bottom target layer 31, the middle target layer 32, and the top target layer 33 are measured. Then a first offset vector may be computed by subtracting the center coordinate of the overlay mark of the middle target layer 32 from the center coordinate of the overlay mark of the bottom target layer 31 (or vice versa), the first offset vector reflects the relative position between the overlay marks of the middle and the bottom target layers. A second offset vector may be computed by subtracting the center coordinate of the overlay mark of the middle target layer 32 from the center coordinate of the overlay mark of the top target layer 33 (or vice versa), the second offset vector reflects the relative position between the overlay marks of the middle and the top target layers. Additionally, a third offset vector may be computed by subtracting the center coordinate of the overlay mark of the bottom target layer 31 from the center coordinate of the overlay mark of the top target layer 33 (or vice versa), the third offset vector reflects the relative position between the overlay marks of the top and the bottom target layers.

Referring to FIG. 2, in step S202, the first offset vector may be decomposed into a first compensable component and a first uncompensable component, and the second offset vector may be decomposed into a second compensable component and a second uncompensable component.

In the embodiments of this inventive concept, each of the offset vectors (e.g., the first, the second, and the third offset vectors) may be decomposed into a compensable component and an uncompensable component. That is, an offset vector can be represented by the sum of its compensable component and its uncompensable component. As described above, an offset vector can be computed from the center coordinates of the overlay marks of corresponding target layers, thus a compensable component may be represented by a model function (discuss in details below) of these center coordinates, and an uncompensable component may be a residue value of the model function.

In step S203, a minimization process is conducted on the first uncompensable component and the second uncompensable component to get minimum values of the first uncompensable component and the second uncompensable component.

Step S203 may further comprise: computing the first compensable component and the second compensable component using nth-order linear regression equations and center coordinates of the overlay marks of the corresponding target layers. The first compensable component and the second compensable component may be computed under least square constraint and each may be represented by an nth-order linear function, with n being a positive integer.

Optionally, step S203 may further comprise: computing the first uncompensable component based on the first offset vector and the first compensable component, and computing the second uncompensable component based on the second offset vector and the second compensable component. The first uncompensable component equals the first offset vector minus the first compensable component, and the second uncompensable component equals the second offset vector minus the second compensable component. The first and the second uncompensable components may each be represented by an nth-order linear function of the center coordinates of the corresponding target layers.

Optionally, step S203 may further comprise: computing minimum values of the first and the second uncompensable components.

The procedures that lead to the minimum values of the first and the second uncompensable components are described below with reference to one specific example.

First, the first compensable component and the second compensable components, each being represented by an nth-order linear function, are computed using nth-order linear regression equations and the center coordinates of the overlay marks of the corresponding target layers.

In one embodiment, the first compensable component may be computed using the center coordinates $(x_1, y_1)$ of the overlay marks of the corresponding target layers (the middle and the bottom target layers) in the following:

$$dX_1 = f'_{x1}(x_1, y_1),$$

$$dY_1 = f'_{y1}(x_1, y_1),$$

wherein $dX_1$ is X component of the first compensable component, and $f''_{x1}(x_1, y_1)$ is a model function for X component of the first compensable component (that is, $dX_1$ is the value of this model function at a given $(x_1, y_1)$), $dY_1$ is Y component of the first compensable component, and $f''_{y1}(x_1, y_1)$ is a model function for Y component of the first compensable component (that is, $dY_1$ is the value of this model function at a given $(x_1, y_1)$).

For example, for a first-order linear regression equation (n=1), the equations $dX_1=f''_{x1}(x_1, y_1)$ and $dY_1=f''_{y1}(x_1, y_1)$ can be written as:

$$dX_1 = A_1 + B_1 x_1 - C_1 y_1,$$

$$dY_1 = D_1 + E_1 y_1 + F_1 x_1,$$

wherein $A_1$ and $D_1$ are the first offset vector's shift amounts in X direction and Y direction, respectively, $B_1$ and $E_1$ are the first offset vector's measurement variations in X direction and Y direction, respectively, and $C_1$ and $F_1$ are X component and Y component of the first offset vector's Wafer Rotation, respectively.

Parameters $A_1$-$F_1$ in the first-order equations discussed above may be computed by fitting first-order linear equations to the center coordinate $(x_1, y_1)$ of the overlay marks of the corresponding target layers under the least square constraint. With parameters $A_1$-$F_1$ known, the first compensable component may be represented by first-order linear functions.

In this embodiment, the higher the order of the linear regression equations (n), the higher the accuracy of the model function to the first compensable component.

The second compensable component may be computed based on the center coordinate $(x_2, y_2)$ of the overlay marks of the corresponding target layers (the top and the middle target layers) in the following:

$$dX_2 = f''_{x2}(x_2, y_2),$$

$$dY_2 = f''_{y2}(x_2, y_2),$$

wherein $dX_2$ is X component of the second compensable component, and $f''_{x2}(x_2, y_2)$ is a model function for X component of the second compensable component (that is, $dX_2$ is the value of this model function at a given $(x_2, y_2)$), $dY_2$ is Y component of the second compensable component, and $f''_{y2}(x_2, y_2)$ is a model function for Y component of the second compensable component (that is, $dY_2$ is the value of this model function at a given $(x_2, y_2)$).

For example, for a first-order linear regression equation (n=1), the equations $dX_2=f''_{x2}(x_2, y_2)$ and $dY_2=f''_{y2}(x_2, y_2)$ can be written as:

$$dX_2 = A_2 + B_2 x_2 - C_2 y_2,$$

$$dY_2 = D_2 + E_2 y_2 + F_2 x_2,$$

wherein $A_2$ and $D_2$ are the second offset vector's shift amounts in X direction and Y direction, respectively, $B_2$ and $E_2$ are the second offset vector's measurement variations in X direction and Y direction, respectively, and $C_2$ and $F_2$ are X component and Y component of the second offset vector's Wafer Rotation, respectively.

Parameters $A_2$-$F_2$ in the first-order equations discussed above may be computed by fitting first-order linear equations to the center coordinate $(x_2, y_2)$ of the overlay marks of the corresponding target layers under the least square constraint. With parameters $A_2$-$F_2$ known, the second compensable component may be represented by first-order linear functions.

In this embodiment, the higher the order of the linear regression equations (n), the higher the accuracy of the model function to the second compensable component.

In one embodiment, when fitting nth-order linear equations to the center coordinates of the overlay marks under the least square constraint, one or more irregular center coordinates, whose positions substantially deviate from the fitting curve, may be removed, and the fitting may be conducted on the remaining center coordinates.

Next, the first uncompensable component of the first offset vector may be computed based on the first offset vector and the first compensable component (represented by nth-order linear functions). The first uncompensable component equals the first offset vector minus the first compensable component.

For example, since $OVL\_X_1 = dX_1 + Rx_1$, $Rx_1 = OVL\_X_1 - dX_1$, wherein $OVL\_X_1$ is X component of the first offset vector, $dX_1$ is X component of the first compensable component, and $Rx_1$ is X component of the first uncompensable component.

Similarly, since $OVL\_Y_1 = dY_1 + Ry_1$, $Ry_1 = OVL\_Y_1 - dY_1$, wherein $OVL\_Y_1$ is Y component of the first offset vector, $dY_1$ is Y component of the first compensable component, and $Ry_1$ is Y component of the first uncompensable component.

The second uncompensable component of the second offset vector may be computed based on the second offset vector and the second compensable component (represented by nth-order equations). The second uncompensable component equals the second offset vector minus the second compensable component.

For example, since $OVL\_X_2 = dX_2\ Rx_2$, $Rx_2 = OVL\_X_2 - dX_2$, wherein $OVL\_X_2$ is X component of the second offset vector, $dX_2$ is X component of the second compensable component, and $Rx_2$ is X component of the second uncompensable component.

Similarly, since $OVL\_Y_2 = dY_2\ Ry_2$, $Ry_2 = OVL\_Y_2 - dY_2$, wherein $OVL\_Y_2$ is Y component of the second offset vector, $dY_2$ is Y component of the second compensable component, and $Ry_2$ is Y component of the second uncompensable component.

From the procedures described above, the first uncompensable component and the second uncompensable component may be computed, each of the first and the second uncompensable components may be represented by an nth-order linear function of the center coordinates of the overlay marks of the corresponding target layers.

Next, minimum values of the first uncompensable component and the second uncompensable component are computed.

The procedures that lead to the minimum values of the first and the second uncompensable components, as described above, may be applied to each wafer or each Shot (i.e., an exposure region) in a wafer to compute minimum values for all the offset vectors in the wafer or the Shot. These minimum values can help to improve the alignment between the overlay marks of the middle and the bottom target layers, and the alignment between the overlay marks of the middle and the top target layers.

Other methods that are well known may also be used to conduct the minimization process and compute the minimum values of the uncompensable components. For example, the minimization process may be conducted through an existing KT-A software, thus the scope of this inventive concept is not limited to the minimization process described herein.

In step S204, optimized first compensable component is computed based on the first offset vector and the minimum value of the first uncompensable component, and optimized second compensable component is computed based on the second offset vector and the minimum value of the second uncompensable component.

For example, optimized first compensable component may be computed by the equation of: (optimized first compensable component)=(the first offset vector)−(minimum value of the first uncompensable component), and optimized second compensable component may be computed by the equation of: (optimized second compensable component)=(the second offset vector)−(minimum value of the second uncompensable component).

In step S205, a third compensable component of a third offset vector that reflects the relative position between the overlay marks of the bottom and the top target layers may be computed based on optimized first compensable component and optimized second compensable component.

Figure 5:
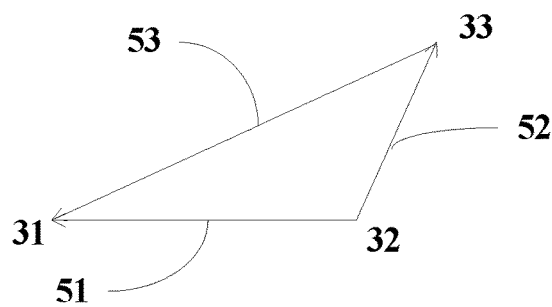
FIG. 5 shows a diagram illustrating the computation of a third compensable component of a third offset vector from a first compensable component and a second compensable component in accordance with one embodiment of this inventive concept.

FIG. 5 shows a diagram illustrating the computation of a third compensable component of a third offset vector from a first compensable component and a second compensable component in accordance with one embodiment of this inventive concept. The method to compute the third compensable component is explained below with reference to FIG. 5.

FIG. 5 shows a first compensable component 51 of a first offset vector, a second compensable component 52 of a second offset vector, and a third compensable component 53 of a third offset vector in accordance with one embodiment of this inventive concept. As shown in FIG. 5, the third compensable component 53 may be computed from the first compensable component 51 and the second compensable component 52 by vector addition/subtraction.

This concludes the description of an overlay compensation method in accordance with one embodiment of this inventive concept. In this method, the first offset vector reflects the relative position between the overlay marks of the middle and the bottom target layers, the second offset vector reflects the relative position between the overlay marks of the middle and the top target layers. These two offset vectors affect the alignments between the corresponding target layers. By conducting a minimization process on the first uncompensable component of the first offset vector and on the second uncompensable component of the second offset vector, minimum values of the first uncompensable component and the second uncompensable component may be obtained, and optimized first compensable component and optimized second compensable component may be computed based on these minimum values. A third compensable component of a third offset vector reflecting the relative position between the overlay marks of the bottom and the top target layers may be computed based on optimized first compensable component and optimized second compensable component.

In this method, priority is given to the alignments between the overlay marks of the middle and the bottom target layers, and between the overlay marks of the middle and the top target layers. Thus, this method reduces the defects caused by mis-alignment between the middle and the top/bottom target layers, it helps to improve the production yield and lower the manufacturing cost.

In one embodiment of this inventive concept, the overlay compensation method may further comprise: computing overlay compensation parameters based on the third compensable component. Optionally, the method may further comprise conducting a compensation process on the overlay marks of the bottom and the top target layers based on the overlay compensation parameters. After the compensation process, the middle target layer may be better aligned with the bottom and the top target layers, thus this compensation process helps to reduce the rework and lower the manufacturing cost.

The overlay compensation parameters may comprise: Translation X, Translation Y, Wafer Rotation (including rotation angle and rotation direction), Wafer Non-Orthogonality, Wafer Expansion X, Wafer Expansion Y, Shot Rotation, Shot Magnification, Shot Asymmetric Rotation, and Shot Asymmetric Magnification. These parameters may be computed using existing methods (for example, using KT-A software) based on the compensable components.

Among these parameters, Translation X, Translation Y, Wafer Rotation, Wafer Non-Orthogonality, Wafer Expansion X, and Wafer Expansion Y are linear compensation parameters, which corresponds to linear shifts/translations of the wafer stage.

Shot Rotation corresponds to the rotation of the reticle, Shot Magnification corresponds to the magnification of the lens.

Shot Asymmetric Rotation may correspond to a combination of Shot Rotation and Shot Non-Orthogonality.

Shot Asymmetric Magnification may correspond to a combination of Shot Magnification and Shot Magnification Y (Y component of Shot Magnification).

Figure 4A:
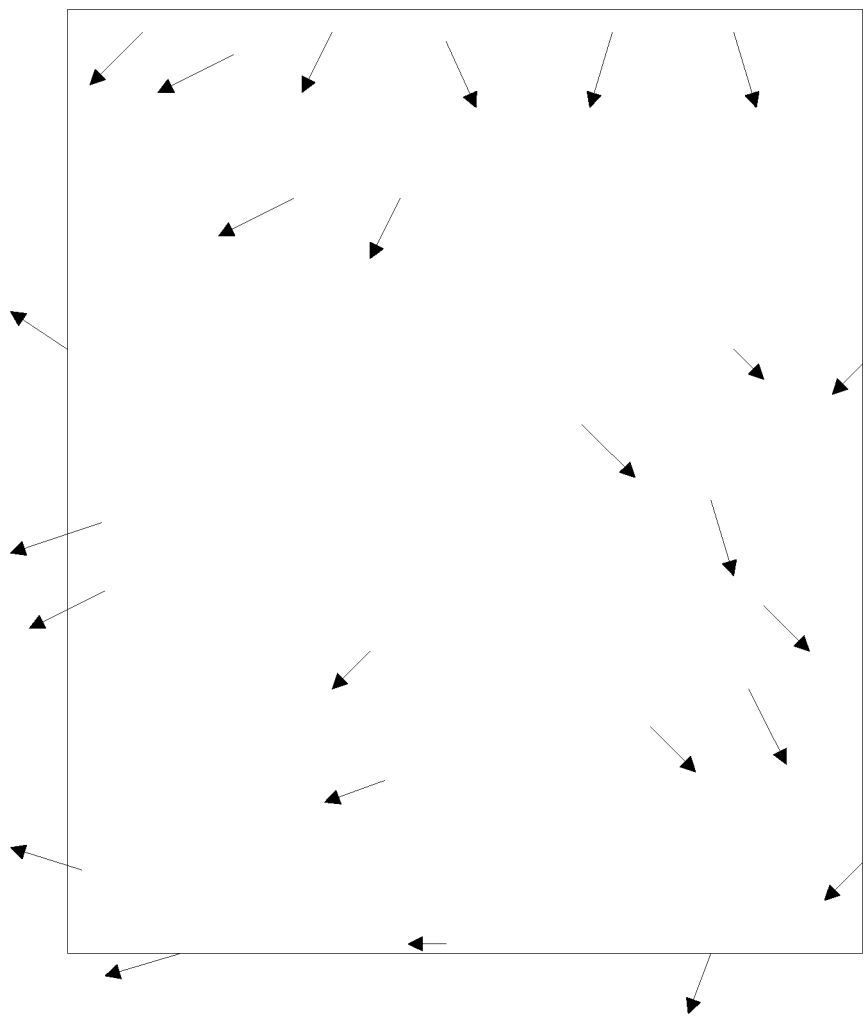
FIG. 4A shows a diagram illustrating some offset vectors in one Shot in one embodiment of this inventive concept.
Figure 4B:
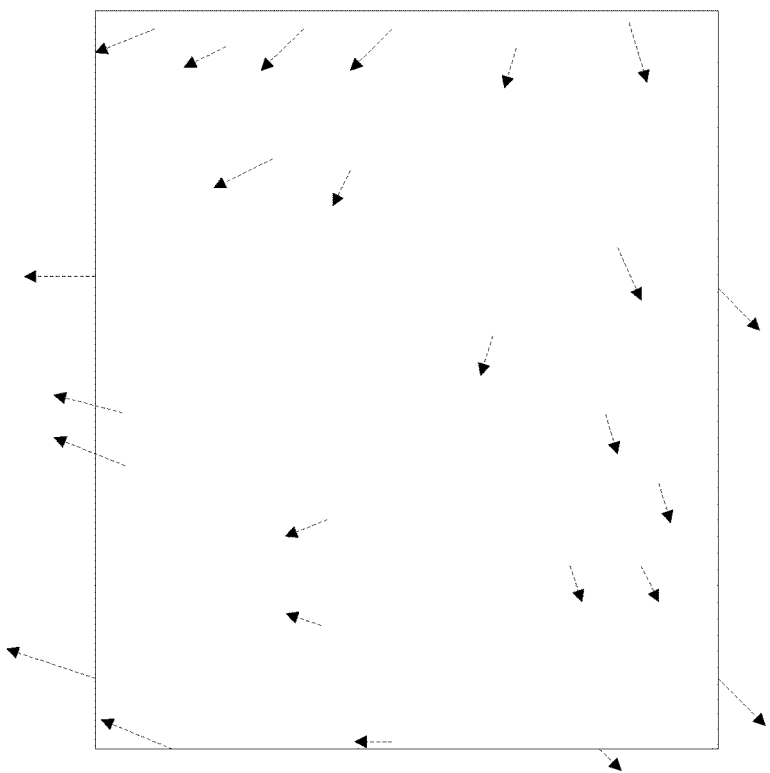
FIG. 4B shows a diagram illustrating compensable components of the offset vectors in FIG. 4A.
Figure 4C:
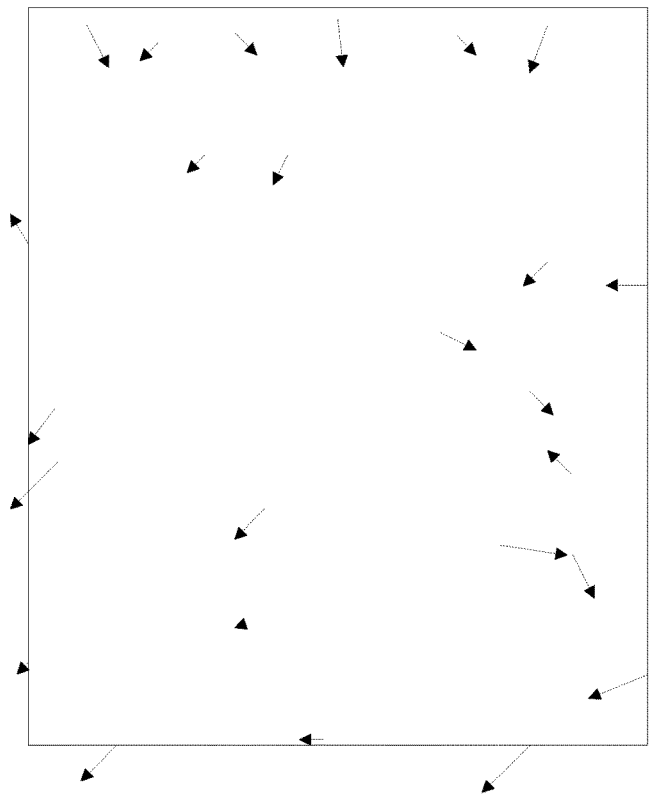
FIG. 4C shows a diagram illustrating uncompensable components of the offset vectors in FIG. 4A.

FIG. 4A shows a diagram illustrating some offset vectors in one Shot in one embodiment of this inventive concept. FIG. 4B shows a diagram illustrating compensable components of the offset vectors in FIG. 4A. FIG. 4C shows a diagram illustrating uncompensable components of the offset vectors in FIG. 4A. Typically, each wafer may include multiple Shots, and each Shot may further include multiple semiconductor structures. Since each of these semiconductor structures may need to be aligned using overlay marks, each Shot may include multiple overlay marks and multiple offset vectors corresponding to these overlay marks, as shown in FIG. 4A. Each offset vector shown in FIG. 4A may be decomposed into a compensable component as shown in FIG. 4B and an uncompensable component as shown in FIG. 4C.

In one embodiment of this inventive concept, $|mean|+3\sigma$, known as independent measurement, may be used to evaluate the effectiveness of the compensation method in this inventive concept comparing with traditional methods, wherein $|mean|$ is the average value of the offset vectors, and $\sigma$ is the standard deviation of these offset vectors.

In one embodiment, all the offset vectors within a Shot or within a wafer (including the first, the second, and the third offset vectors) may first be normalized, and the independent measurements for these normalized offset vectors may be computed. Independent measures for the first, the second, and the third offset vectors may be separately computed, and each of these independent measurements may include a X component and a Y component.

Next, the procedure to compute an independent measurement is described below using the first offset vector as an example. Each of the first offset vectors in a wafer is first decomposed into X component and Y component, then the average ($|mean|_x$) and the deviation ($\sigma_x$) of all the X components, and the average ($|mean|_y$) and the deviation ($\sigma_y$) of all the Y components are computed, then the independent measurement for the first offset vector at X direction is $|mean|_x+3\sigma_x$, and the independent measurement for the first offset vector at Y direction is $|mean|_y+3\sigma_y$.

The procedures to compute independent measurements for the second and the third offset vectors are similar to that for the first offset vector, and thus are not repeatedly described here.

Table 1 shows a comparison result between the independent measurements from conventional method and that after the optimization process in this inventive concept.

TABLE 1

Comparison between the independent measurements from conventional method and that after the optimization process in this inventive concept.

| | Independent measurements (X component/Y component) | | |
|---|---|---|---|
| | 33_31 | 32_31 | 32_33 |
| conventional method (nm) | 2.29/2.05 | 5.82/7.70 | 3.33/2.90 |
| this inventive concept (nm) | 5.68/5.80 | 3.67/3.15 | 4.01/4.07 |

In Table 1, a bottom target layer is designated as 31, a middle target layer is designated as 32, and a top target layer is designated as 33. A third offset vector reflecting the relative position between the top and the bottom target layers is designated as 33_31, a first offset vector reflecting the relative position between the middle and the bottom target layers is designated as 32_31, and a second offset vector reflecting the relative position between the middle and the top target layers is designated as 32_33. The independent measurements in Table 1 show the alignment accuracy between corresponding target layers. In each Shot in a wafer, the independent measurement is computed by |mean|+3σ. Table 1 shows that, in this inventive concept, the independent measurements for the first offset vectors (in column 32_31) is smaller than those in conventional method, indicating an improved alignment between the middle and the bottom target layers.

Figure 6:
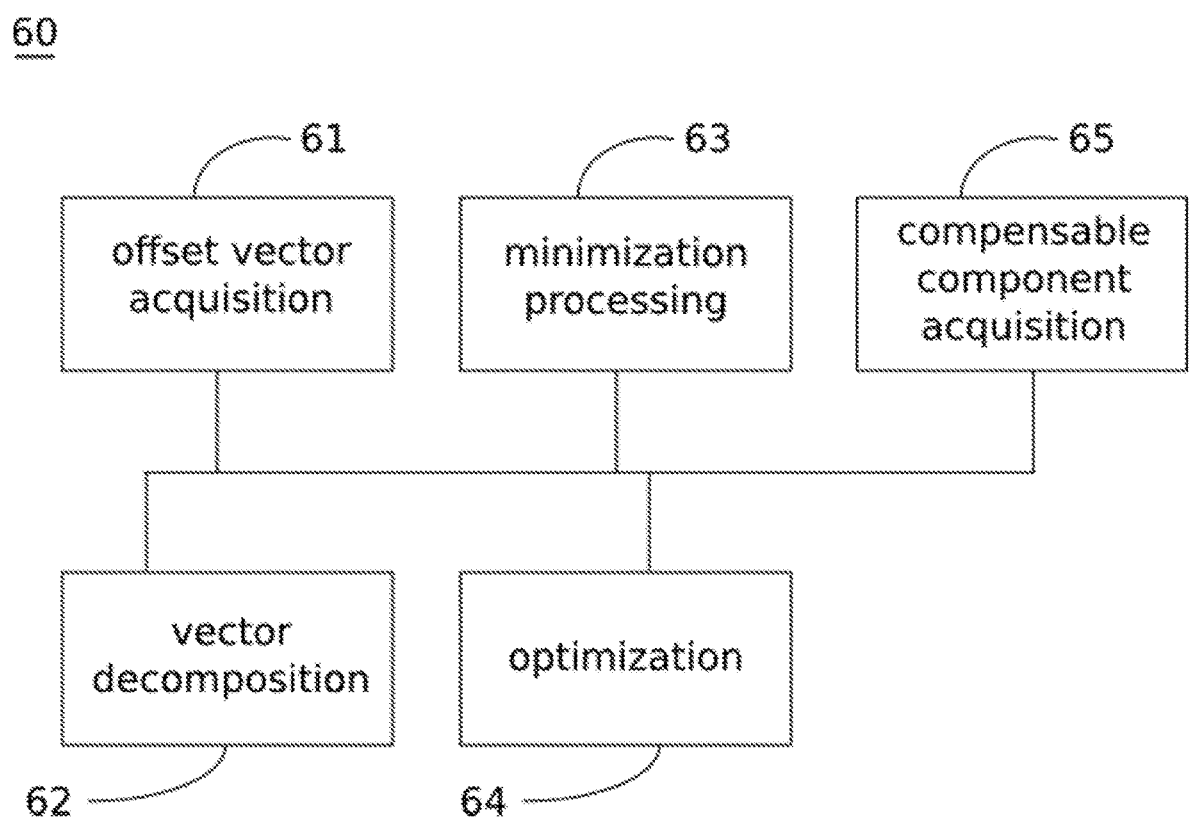
FIG. 6 shows a diagram illustrating an overlay compensation system in accordance with one embodiment of this inventive concept.

FIG. 6 shows a diagram illustrating an overlay compensation system in accordance with one embodiment of this inventive concept. As shown in FIG. 6, the overlay compensation system 60 may comprise an offset vector acquisition unit 61, a vector decomposition unit 62, a minimization processing unit 63, an optimization unit 64, and a compensable component acquisition unit 65.

The offset vector acquisition unit 61 acquires a first offset vector reflecting the relative position between the middle and the bottom target layers, and a second offset vector reflecting the relative position between the middle and the top target layers.

The vector decomposition unit 62 decomposes the first offset vector into a first compensable component and a first uncompensable component, and decomposes the second offset vector into a second compensable component and a second uncompensable component.

The minimization processing unit 63 conducts a minimization process on the first and the second uncompensable components and gets the minimum values of the first and the second uncompensable components.

The optimization unit 64 computes the optimized value of the first compensable component based on the first offset vector and the minimum value of the first uncompensable component, and computes the optimized value of the second compensable component based on the second offset vector and the minimum value of the second uncompensable component.

The compensable component acquisition unit 65 computes a third compensable component of a third offset vector reflecting the relative position of the overlay marks of the bottom and the top target layers based on optimized first compensable component and optimized second compensable component.

This concludes the description of an overlay compensation system in accordance with one embodiment of this inventive concept. In this system, priority is given to the alignments between the overlay marks of the middle and the bottom target layers, and between the overlay marks of the middle and the top target layers. Thus, this system reduces the defects caused by mis-alignment between the middle and the top/bottom target layers, and it helps to improve the production yield and lower the manufacturing cost.

Figure 7:
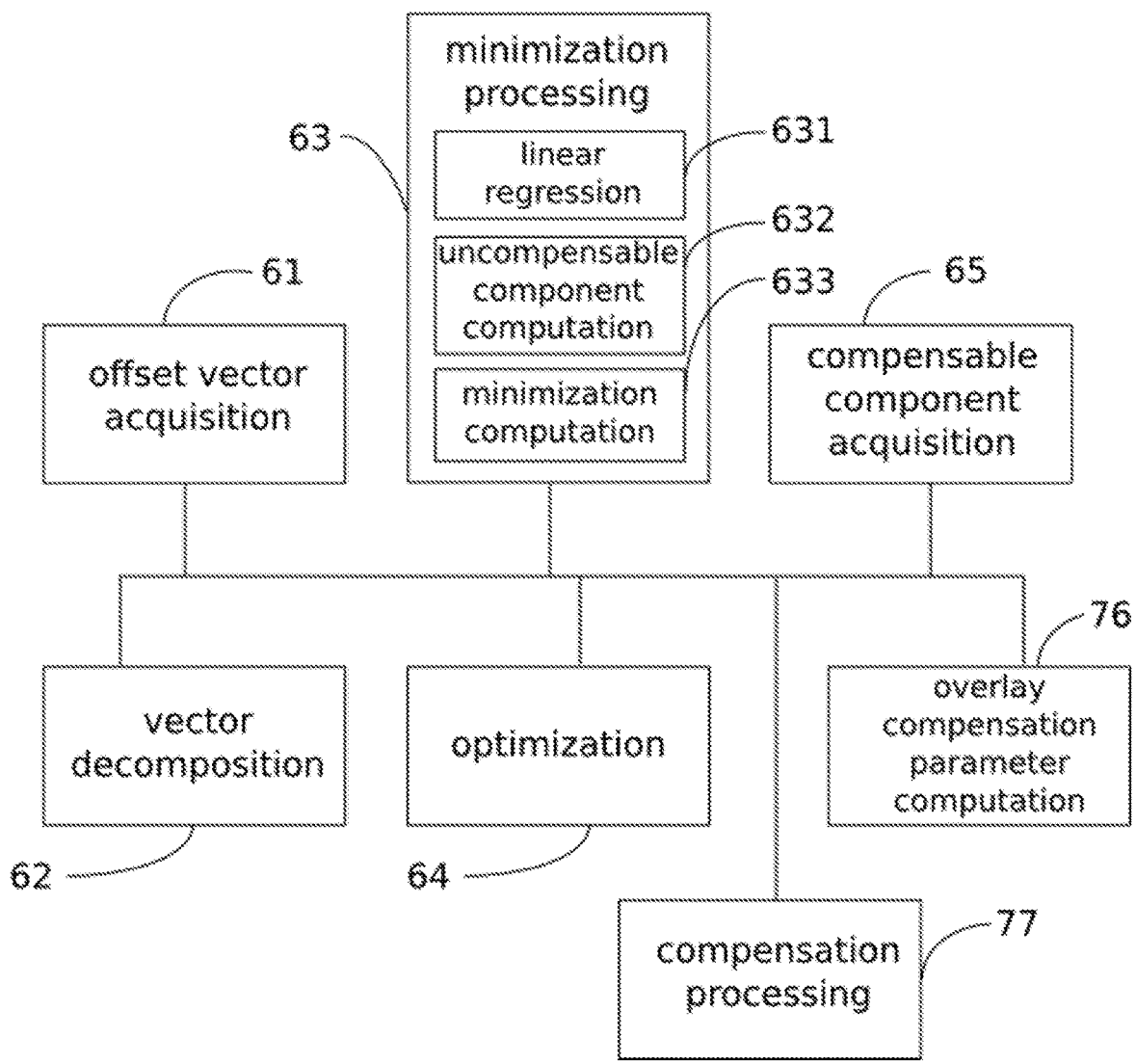
FIG. 7 shows a diagram illustrating an overlay compensation system in accordance with another embodiment of this inventive concept.

FIG. 7 shows a diagram illustrating an overlay compensation system in accordance with another embodiment of this inventive concept. As shown in FIG. 7, this overlay compensation system 70 may include all the units shown in the system of FIG. 6, including the offset vector acquisition unit 61, the vector decomposition unit 62, the minimization processing unit 63, the optimization unit 64, and the compensable component acquisition unit 65. Additionally, the overlay compensation system 70 may further comprise other additional units.

As shown in FIG. 7, in one embodiment, the overlay compensation system 70 may further comprise an overlay compensation parameter computation unit 76, which computes overlay compensation parameters based on the third compensable components. The overlay compensation parameters may comprise: Translation X, Translation Y, Wafer Rotation (including rotation angle and rotation direction), Wafer Non-Orthogonality, Wafer Expansion X, Wafer Expansion Y, Shot Rotation, Shot Magnification, Shot Asymmetric Rotation, and Shot Asymmetric Magnification.

As shown in FIG. 7, in one embodiment, the overlay compensation system 70 may further comprise a compensation processing unit 77, which conducts a compensation process on the overlay marks on the bottom and the top target layers based on overlay compensation parameters.

As shown in FIG. 7, in one embodiment, the minimization processing unit 63 may comprise a linear regression unit 631, an uncompensable component computation unit 632, and a minimization computation unit 633.

The linear regression unit 631 uses nth-order linear regression equations to compute the first compensable component and the second compensable component based on center coordinates of the overlay marks of the corresponding target layers. Each of the first and the second compensable components is represented by an nth-order linear function, wherein n is a positive integer. For example, the first and the second compensable components, each being represented by an nth-order linear function, may be computed by fitting nth-order linear regression equations to the center coordinates of the overlay marks of the corresponding target layers under the least square constraint.

The uncompensable component computation unit 632 may compute the first uncompensable component based on the first offset vector and the first compensable component, and computes the second uncompensable component based on the second offset vector and the second compensable component. The first uncompensable component equals the first offset vector minus the first compensable component, and the second uncompensable component equals the second offset vector minus the second compensable component. Each of the first and the second uncompensable components is an nth-order function of the center coordinates of the overlay marks of the corresponding target layers.

The minimization computation unit 633 computes the minimum values of the first uncompensable component and the second uncompensable component.

It should be understood that the overlay compensation method and the related system of this inventive concept are described using a three-layer (i.e., the top, the middle, and the bottom target layers) semiconductor structure as an example. This inventive concept, however, is not limited herein, the overlay compensation method and the related system may also be applied on a semiconductor structure with more than three layers (such as a six-layer, nine-layer, or twelve-layer structure), they may also be applied on Self-Aligned Double Patterning (SADP) techniques.

This inventive concept further provides a machine readable storage medium with computer instructions stored in it. When the computer instructions are executed, one of the aforementioned overlay compensation methods, such as that shown in FIG. 2, may be conducted.

The overlay compensation method and the related system of this inventive concept may be implemented in many different ways such as in digital electronic circuitry, or in computer software, firmware, or hardware, including the structures disclosed in this specification and their structural equivalents, or in combinations of one or more of them. The computer can be implemented as a combination of computer hardware including a processor and a memory with one or more computer program products, i.e., one or more modules of computer program instructions encoded on a computer-readable medium for execution by, or to control the operation of, data processing apparatus.

A computer program (also known as a program, software, software application, script, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub-programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device, e.g., a mobile telephone, a personal digital assistant (PDA), a mobile audio player, a Global Positioning System (GPS) receiver, to name just a few. Computer-readable media suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in, special purpose logic circuitry.

The particular order in which the procedures of this method are described in this application is for descriptive purposes only, thus this inventive concept is not limited by this order unless it is specified otherwise. Additionally, in some embodiments, the overlay compensation method of this inventive concept may be implemented as computer instructions stored in machine readable storage medium, thus this inventive concept may also cover the machine readable storage medium storing the computer instructions.

This concludes the description of an overlay compensation method and a system thereof in accordance with one or more embodiments of this inventive concept. For the purpose of conciseness and convenience, some components or procedures that are well known to one of ordinary skill in the art in this field are omitted. These omissions, however, do not prevent one of ordinary skill in the art in this field to make and use the inventive concept herein disclosed.

While this inventive concept has been described in terms of several embodiments, there are alterations, permutations, and equivalents, which fall within the scope of this disclosure. It shall also be noted that there are alternative ways of implementing the methods and apparatuses of the inventive concept. Furthermore, embodiments may find utility in other applications. It is therefore intended that the claims be interpreted as including all such alterations, permutations, and equivalents. The abstract section is provided herein for convenience and, due to word count limitation, is accordingly written for reading convenience and shall not be employed to limit the scope of the claims.

What is claimed is:

1. An overlay compensation method, comprising:
 acquiring a first offset vector reflecting the relative position between an overlay mark of a middle target layer and an overlay mark of a bottom target layer;
 acquiring a second offset vector reflecting the relative position between an overlay mark of a top target layer and the overlay mark of the middle target layer;
 decomposing the first offset vector into a first compensable component and a first uncompensable component;
 decomposing the second offset vector into a second compensable component and a second uncompensable component;
 conducting a minimization process on the first uncompensable component and the second uncompensable component to compute minimum values of the first uncompensable component and the second uncompensable component;
 computing an optimized first compensable component based on the first offset vector and the minimum value of the first uncompensable component;
 computing an optimized second compensable component based on the second offset vector and the minimum value of the second uncompensable component; and computing a third compensable component of a third offset vector reflecting the relative position between the overlay marks of the top target layer and the bottom target layer based on optimized first compensable component and optimized second compensable component.

2. The method of claim 1, further comprising:
computing overlay compensation parameters based on the third compensable component; and
conducting a compensation process on the overlay mark of the bottom target layer and the overlay mark of the top target layer based on the overlay compensation parameters.

3. The method of claim 1, wherein conducting a minimization process on the first uncompensable component and the second uncompensable component comprises:
computing the first compensable component and the second compensable component based on nth-order linear regression equations and center coordinates of the overlay marks of the corresponding target layers, wherein the first compensable component and the second compensable component are each represented by an nth-order linear function, with n being a positive integer;
computing the first uncompensable component based on the first offset vector and the first compensable component, wherein the first uncompensable component equals to the first offset vector minus the first compensable component, and wherein the first uncompensable component is an nth-order function of the center coordinates of the overlay marks of the middle and the bottom target layers;
computing the second uncompensable component based on the second offset vector and the second compensable component, wherein the second uncompensable component equals to the second offset vector minus the second compensable component, and wherein the second uncompensable component is an nth-order function of the center coordinates of the overlay marks of the top and the middle target layers; and
computing minimum values of the first and the second uncompensable components.

4. The method of claim 3, wherein the first compensable component and the second compensable component are computed based on the nth-order linear regression equations and the center coordinates of the overlay marks of the corresponding target layers under the least square constraint.

5. The method of claim 2, wherein the overlay compensation parameters comprise:
Translation X, Translation Y, Wafer Rotation (including rotation angle and rotation direction), Wafer Non-Orthogonality, Wafer Expansion X, Wafer Expansion Y, Shot Rotation, Shot Magnification, Shot Asymmetric Rotation, and Shot Asymmetric Magnification.

6. An overlay compensation system, comprising:
an offset vector acquisition unit that acquires a first offset vector and a second offset vector, wherein the first offset vector reflects the relative position between an overlay mark of a middle target layer and an overlay mark of a bottom target layer, and the second offset vector reflects the relative position between an overlay mark of a top target layer and the overlay mark of the middle target layer;
a vector decomposition unit that decomposes the first offset vector into a first compensable component and a first uncompensable component, and decomposes the second offset vector into a second compensable component and a second uncompensable component;
a minimization processing unit that conducts a minimization process on the first uncompensable component and the second uncompensable components to get minimum values of the first uncompensable component and the second uncompensable component;
an optimization unit that computes an optimized first compensable component based on the first offset vector and the minimum value of the first uncompensable component, and computes an optimized second compensable component based on the second offset vector and the minimum value of the second uncompensable component; and
a compensable component acquisition unit that, based on optimized first compensable component and optimized second compensable component, computes a third compensable component of a third offset vector that reflects the relative position between the overlay mark of the top target layer and the overlay mark the bottom target layer.

7. The system of claim 6, further comprising:
an overlay parameter computation unit that computes overlay compensation parameters based on the third compensable component; and
a compensation process unit that conducts a compensation process on the overlay marks of the bottom and the top target layers based on the overlay compensation parameters.

8. The system of claim 6, wherein the minimization process unit comprises:
a linear regression computation module that computes the first compensable component and the second compensable component based on nth-order linear regression equations and center coordinates of the overlay marks of the corresponding target layers, wherein the first compensable component and the second compensable component are each represented by an nth-order linear function, with n being a positive integer;
an uncompensable component computation module that computes the first uncompensable component and the second uncompensable component, wherein the first uncompensable component is computed based on the first offset vector and the first compensable component, and equals to the first offset vector minus the first compensable component, and the second uncompensable component is computed based on the second offset vector and the second compensable component, and equals to the second offset vector minus the second compensable component, and wherein the first uncompensable component is an nth-order function of the center coordinates of the overlay marks of the middle and the bottom target layers, and the second uncompensable component is an nth-order function of the center coordinates of the overlay marks of the top and the middle target layers; and
a minimization computation module that computes minimum values of the first uncompensable component and the second uncompensable component.

9. The system of claim 8, wherein the linear regression computation module computes the first compensable component and the second compensable component based on the nth-order linear regression equations and the center coordinates of the overlay marks of the corresponding target layers under the least square constraint.

10. The system of claim 7, wherein the overlay compensation parameters comprise:
Translation X, Translation Y, Wafer Rotation (including rotation angle and rotation direction), Wafer Non- Orthogonality, Wafer Expansion X, Wafer Expansion Y, Shot Rotation, Shot Magnification, Shot Asymmetric Rotation, and Shot Asymmetric Magnification.

11. A machine readable storage medium with computer instructions stored in it, wherein when the computer instructions are executed, the method of claim 1 is conducted.

12. A machine readable storage medium with computer instructions stored in it, wherein when the computer instructions are executed, the method of claim 2 is conducted.

13. A machine readable storage medium with computer instructions stored in it, wherein when the computer instructions are executed, the method of claim 3 is conducted.

14. A machine readable storage medium with computer instructions stored in it, wherein when the computer instructions are executed, the method of claim 4 is conducted.

15. A machine readable storage medium with computer instructions stored in it, wherein when the computer instructions are executed, the method of claim 5 is conducted.

* * * * *